(12) United States Patent
Hayes et al.

(10) Patent No.: US 12,406,896 B2
(45) Date of Patent: Sep. 2, 2025

(54) SEMICONDUCTOR DEVICE PACKAGE HAVING THERMAL DISSIPATION FEATURE AND METHOD THEREFOR

(71) Applicant: NXP USA, INC., Austin, TX (US)

(72) Inventors: Scott M. Hayes, Chandler, AZ (US); Michael B. Vincent, Chandler, AZ (US); Zhiwei Gong, Chandler, AZ (US); Rushik P. Tank, Chandler, AZ (US); Kabir Mirpuri, Scottsdale, AZ (US); Betty Hill-Shan Yeung, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 139 days.

(21) Appl. No.: 17/241,156

(22) Filed: Apr. 27, 2021

(65) Prior Publication Data
US 2022/0344235 A1    Oct. 27, 2022

(51) Int. Cl.
*H01L 23/367* (2006.01)
*H01L 21/48* (2006.01)

(52) U.S. Cl.
CPC ...... *H01L 23/3672* (2013.01); *H01L 21/4871* (2013.01)

(58) Field of Classification Search
CPC .............. H01L 23/3672; H01L 21/4871; H01L 23/367; H01L 24/73; H01L 24/92; H01L 23/42; H01L 23/49816; H01L 24/13; H01L 24/16; H01L 24/29; H01L 24/32; H01L 24/81; H01L 24/83; H01L 2224/13101; H01L 2224/13144; H01L 2224/13147; H01L 2224/16225; H01L 2224/2919; H01L 2224/32225; H01L 2224/32245; H01L 2224/73204; H01L 2224/73253; H01L 2224/83101; H01L 2224/83801; H01L 2224/8385; H01L 2224/92226; H01L 2224/92246; H01L 2924/15321; H01L 23/3677; H01L 23/66; H01L 2223/6677;
(Continued)

(56) References Cited

U.S. PATENT DOCUMENTS 6,146,921 A * 11/2000 Barrow ............... H01L 23/4334
                                                      438/126
6,255,143 B1    7/2001 Briar
(Continued)

FOREIGN PATENT DOCUMENTS

EP          3690935 A1    8/2020
WO      2017222471 A1    12/2017

OTHER PUBLICATIONS

U.S. Appl. No. 17/113,345, filed Dec. 7, 2020, entitled "Semiconductor Device Package Having Thermal Dissipation Feature and Method Therefor".

*Primary Examiner* — Duy T Nguyen (57) ABSTRACT

A semiconductor device package having a thermal dissipation feature is provided. The semiconductor device package includes a package substrate. A semiconductor die is mounted on a first surface of the package substrate. A thermal conductive structure including a die pad portion is affixed to the semiconductor die. A limb portion of the thermal conductive structure extends laterally away from the die pad portion and overlaps a portion of the package substrate. A thermal conduction path is formed between the semiconductor die and a distal end of the limb portion.

15 Claims, 12 Drawing Sheets

(58) Field of Classification Search
CPC ....... H01L 21/4814–4896; H01L 23/36–3738; H01L 23/488–49894; H01L 24/10–17; H01L 24/93; H05K 3/3436
USPC .......................................................... 257/717
See application file for complete search history.

(56) References Cited

U.S. PATENT DOCUMENTS

| | | | |
|---|---|---|---|
| 6,504,723 B1* | 1/2003 | Fitzgerald | H01L 23/3675 257/713 |
| 7,355,289 B2 | 4/2008 | Hess et al. | |
| 7,361,972 B2 | 4/2008 | Chen | |
| 7,362,580 B2* | 4/2008 | Hua | H01L 23/3735 257/E23.09 |
| 8,143,100 B2 | 3/2012 | Karnezos | |
| 9,355,985 B2 | 5/2016 | Vincent et al. | |
| 9,673,175 B1* | 6/2017 | Bharatham | H01L 23/49827 |
| 2003/0214049 A1 | 11/2003 | Hortaleza et al. | |
| 2004/0084763 A1* | 5/2004 | Yang | H01L 23/3675 257/E23.101 |
| 2005/0112796 A1* | 5/2005 | Ararao | H01L 23/3672 438/106 |
| 2006/0249852 A1* | 11/2006 | Chiu | H01L 23/36 257/E23.101 |
| 2007/0148821 A1* | 6/2007 | Do | H01L 25/0657 438/109 |
| 2008/0291115 A1 | 11/2008 | Doan et al. | |
| 2009/0045505 A1 | 2/2009 | Hsu | |
| 2011/0079902 A1* | 4/2011 | Sakamoto | H01L 21/563 257/788 |
| 2012/0126396 A1 | 5/2012 | Zhao et al. | |
| 2012/0241941 A1 | 9/2012 | Kim et al. | |
| 2013/0037936 A1* | 2/2013 | Choi | H01L 23/49833 257/737 |
| 2014/0054802 A1 | 2/2014 | Shim et al. | |
| 2017/0278816 A1 | 9/2017 | Li et al. | |
| 2019/0393172 A1 | 12/2019 | Pietambaram et al. | |
| 2021/0280507 A1 | 9/2021 | Aldrete et al. | |
| 2022/0181230 A1 | 6/2022 | Vincent et al. | |

* cited by examiner

FIG. 11 and is not limited by the accompanying figures, in which like references indicate similar elements. Elements in the figures are illustrated for simplicity and clarity and have not necessarily been drawn to scale.
SEMICONDUCTOR DEVICE PACKAGE HAVING THERMAL DISSIPATION FEATURE AND METHOD THEREFOR

BACKGROUND

Field

This disclosure relates generally to semiconductor device packaging, and more specifically, to a semiconductor device package having thermal dissipation feature and method of forming the same.

Related Art

Today, there is an increasing trend to include sophisticated semiconductor devices in products and systems that are used every day. These sophisticated semiconductor devices often have sensitive circuitry and features that can be adversely affected by environmental conditions. For example, the performance of a semiconductor device may be degraded due to excessive heat accumulation. In extreme cases, a semiconductor device may be rendered non-functional due to excessive heat accumulation. Accordingly, there is a need to reduce or eliminate the effects of environmental conditions on such semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device package having a thermal dissipation feature. An external thermal conductive structure is affixed to a semiconductor die to form the thermal dissipation structure at a bottom of the package. The external thermal conductive structure includes a die pad portion and a plurality of limb portions which extend over the package substrate. The bottom of the package is attached and interconnected with a printed circuit board by way of conductive connectors. The thermal conductive structure forms a thermal conduction path between the semiconductor die and the printed circuit board. With the thermal conductive structure affixed at the bottom of the package, a top surface of the package remains unobstructed. Accordingly, an antenna structure integrated at the top surface of the package allows for propagation of radio signals, for example, while providing enhanced heat dissipation at the bottom surface of the package. Other features such as a package-on-package interface structure, surface mount technology structure, die bonding structure, shielding structure, and the like may be integrated at the top surface of the package.

Figure 1:
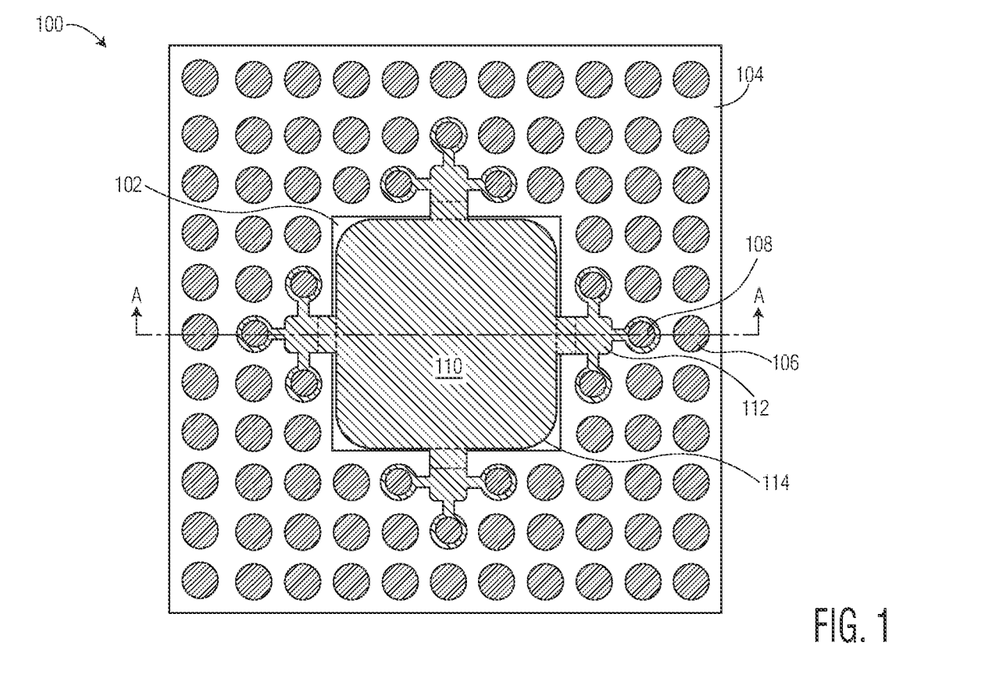
FIG. 1 illustrates, in a simplified bottom-side-up plan view, an example semiconductor device package having a thermal dissipation feature in accordance with an embodiment.

FIG. 1 illustrates, in a simplified bottom-side-up plan view, an example semiconductor device package 100 having a thermal dissipation feature in accordance with an embodiment. The package 100 includes a semiconductor die 102 mounted on a package substrate 104 having conductive connectors 106 and 108. The thermal dissipation feature is formed as an external thermal conductive structure 110 affixed on the semiconductor die 102. In this embodiment, the thermal conductive structure 110 includes a die pad portion 114 and four limb portions 112 extending laterally away from the die pad portion and suspended over portions of the package substrate 104. The limb portions 112 include a region formed at a distal end of each limb configured for attachment to a printed circuit board (PCB) by way of conductive connectors 108, for example. Cross-sectional views of examples of the semiconductor device package 100 having a thermal dissipation feature taken along line A-A at stages of manufacture are depicted in FIG. 2 through FIG. 6.

The semiconductor die 102 has an active side (e.g., major side having circuitry, bond pads) and a backside (e.g., major side opposite of the active surface). As depicted in the bottom-side-up plan view of FIG. 1, the active side of the semiconductor die 102 is mounted on the package substrate 104 and interconnected utilizing bond pads (not shown) at the active side, for example. In this embodiment, the semiconductor die 102 is configured in a flip-chip orientation having the active side mounted on the package substrate 104. The semiconductor die 102 may be formed from any suitable semiconductor material, such as silicon, germanium, gallium arsenide, gallium nitride, and the like. Semiconductor die 102 may further include any digital circuits, analog circuits, RF circuits, memory, processor, the like, and combinations thereof at the active surface.

The package substrate 104 has a top surface and a bottom surface (e.g., major surface opposite of the top surface). As depicted in the bottom-side-up plan view of FIG. 1, the active side of the semiconductor die 102 and conductive connectors 106 and 108 are mounted at the bottom surface of the package substrate 104, for example. The conductive connectors 106 may be characterized as input/output and power supply connectors whereas the conductive connectors 108 may be characterized as thermal conduction and heat dissipation path connectors. In some embodiments, the conductive connectors 108 may be configured for connection to a ground power supply, for example, in addition to being part of a thermal conduction and heat dissipation path. The conductive connectors 106 and 108 may be formed in any suitable conductive connector structures such as solder balls, gold studs, copper pillars, and the like. In this embodiment, the conductive connectors 106 and 108 are formed as ball connectors, for example, and arranged in a ball grid array (BGA). The package substrate 104 is formed as a multi-layer laminate structure having conductive features (e.g., metal traces, pads) separated by non-conductive material (e.g., FR-4). In this embodiment, the package substrate 104 is characterized as a chip scale package (CSP) type package substrate.

The thermal conductive structure 110 affixed to the semiconductor die 102 forms a thermal conduction and heat dissipation path between the semiconductor die 102 and conductive connectors 108. The thermal conductive structure 110 may be formed from suitable thermal conductive materials such as copper, silver, nickel, aluminum, and the like. The thermal conductive structure 110 including the die pad portion 114 and the limb portions 112 may be formed from a stamped or etched metal sheet. For example, the thermal conductive structure 110 may be manufactured in a manner consistent with the manufacture of a package leadframe. The thermal conductive structure 110 may be affixed to the semiconductor die 102 by way of a thermally conductive adhesive or solder, for example. The thermal conductive structure 110 may be affixed to the semiconductor die 102 of packages while in an array (e.g., strip) form or in singulated form.

FIG. 2 through FIG. 6 illustrate, in simplified cross-sectional views, the example semiconductor device package 100 taken along line A-A of FIG. 1 at stages of manufacture in accordance with an embodiment.

Figure 2:
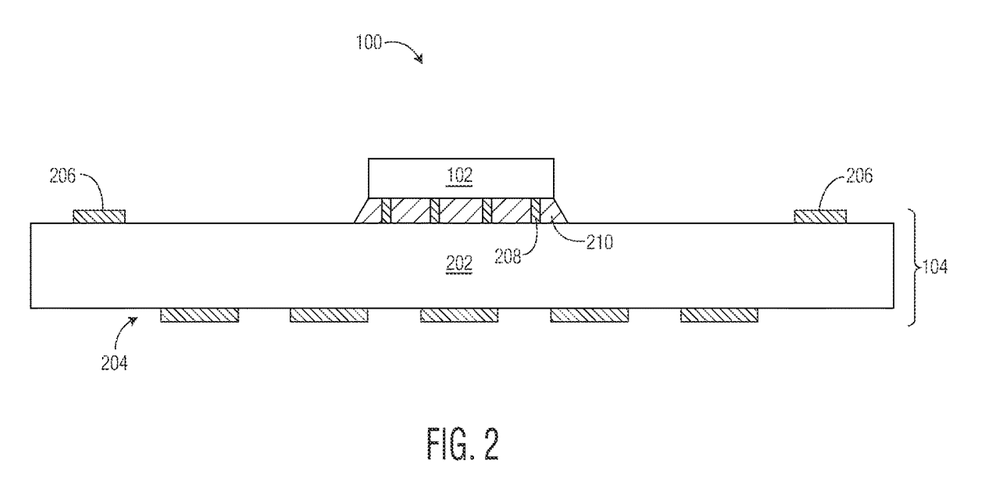
FIG. 2 through FIG. 6 illustrate, in simplified cross-sectional views, the example semiconductor device package of FIG. 1 at stages of manufacture in accordance with an embodiment.

FIG. 2 illustrates, in a simplified bottom-side-up cross-sectional view, the example semiconductor device package 100 at a stage of manufacture in accordance with an embodiment. At this stage, the package 100 includes the active side of the semiconductor die 102 interconnected with the bottom surface of the package substrate 104 by way of conductive die connectors 208 and underfilled with an epoxy material 210. The die connectors 208 may be any suitable die connector structure such as solder bumps, gold studs, copper pillars, and the like. Features such as bond pads on the semiconductor die 102 and corresponding pads on the package substrate 104 are not shown for illustration purposes.

The package substrate 104 is formed as a multi-layer laminate structure having conductive features separated by a non-conductive material. In this embodiment, the package substrate 104 includes connector pads 206 located at the bottom surface and a conductive structure 204 integrated at the top surface of the package substrate 104. In this embodiment, the integrated conductive structure 204 is characterized as an antenna structure configured for propagation of radio frequency (RF) signals such as a radar, Wi-Fi, UWB, 5G and 6G signals, for example. In other embodiments, the integrated conductive structure 204 may include features such as a package-on-package (PoP) interface structure, surface mount technology structure, die bonding structure, shielding structure, and the like integrated at the top surface of the package substrate 104. The connector pads 206 and the integrated conductive structure 204 are separated by a non-conductive material 202. The connector pads 206 and the integrated conductive structure 204 may be formed from a suitable metal such as copper, for example. Interconnect features such as conductive vias and traces embedded in the package substrate 104 are not shown for illustration purposes.

Figure 3:
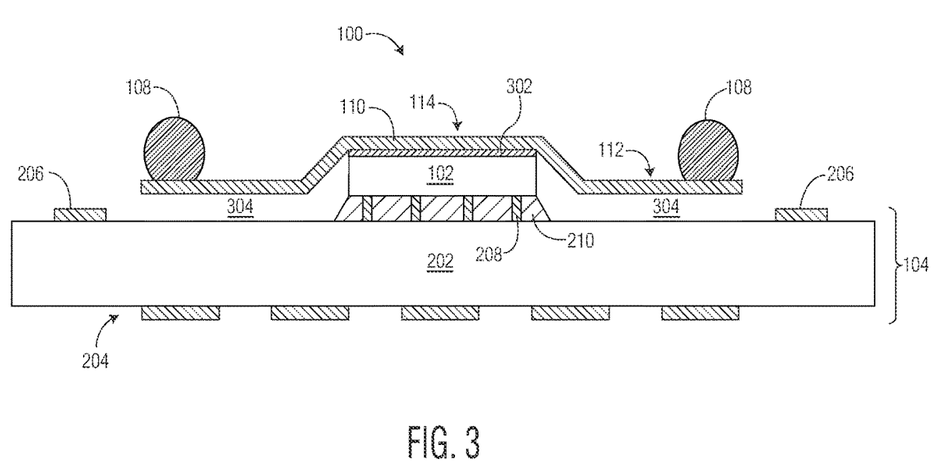

FIG. 3 illustrates, in a simplified bottom-side-up cross-sectional view, the example semiconductor device package 100 at a subsequent stage of manufacture in accordance with an embodiment. At this stage, the package 100 includes the thermal conductive structure 110 is mounted on the semiconductor die 102 and conductive connectors 108 are affixed on thermal conductive structure 110. In this embodiment, the thermal conductive structure 110 includes the die pad portion 114 affixed to the backside of the semiconductor die 102 by way of a thermal conductive bonding material 302 (e.g., thermally conductive adhesive, solder, paste, epoxy, die attach film). The limb portions 112 extend laterally away from the die pad portion 114 and are downset forming a gap 304 between the limb portions 112 and the bottom surface of the package substrate 104. The gap 304 may be an air gap or filled with a low modulus material (e.g., for mechanical stability) or a thermally conductive material (e.g., for additional thermal conduction, dissipation), for example. The conductive connectors 108 are affixed at the distal ends of the limb portions 112. A region at the distal ends of the limb portions 112 may include features such as plating and/or dimples conducive for attachment of conductive connectors, for example. The conductive connectors 108 be any suitable conductive connector structures such as solder balls, gold studs, copper pillars, and the like. In some embodiments, conductive connectors 108 may be formed with enhanced thermal conductivity materials and/or structures.

Figure 4:
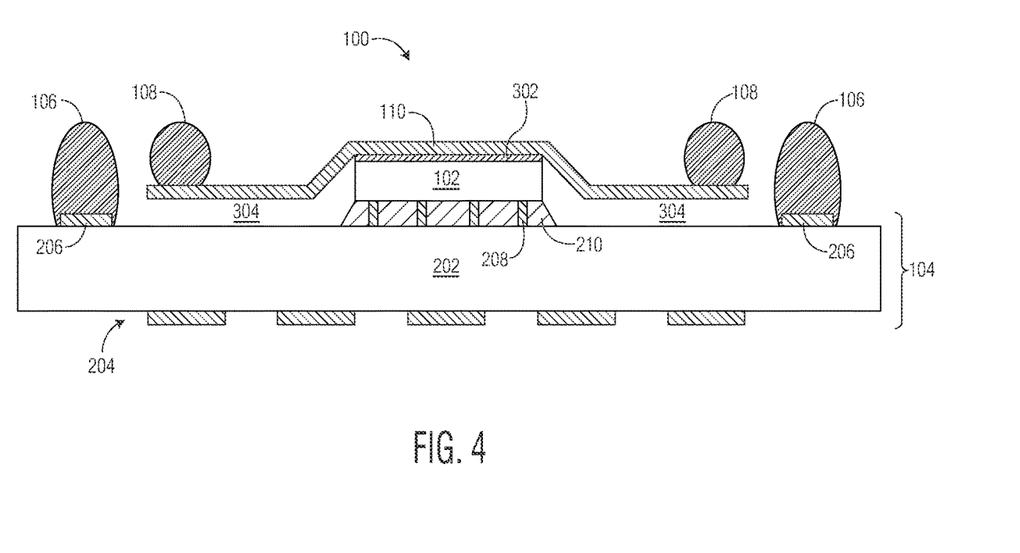

FIG. 4 illustrates, in a simplified bottom-side-up cross-sectional view, the example semiconductor device package 100 at a subsequent stage of manufacture in accordance with an embodiment. At this stage, the package 100 includes the thermal conductive structure 110 mounted on the semiconductor die 102 and conductive connectors 106 affixed on connector pads 206. After the thermal conductive structure 110 is mounted on the semiconductor die 102, the conductive connectors 106 are affixed on the respective connector pads 206. In this embodiment, the conductive connectors 106 are coupled to provide input/output and power supply connections to the semiconductor die 102 by way of the connector pads 206.

Figure 5:
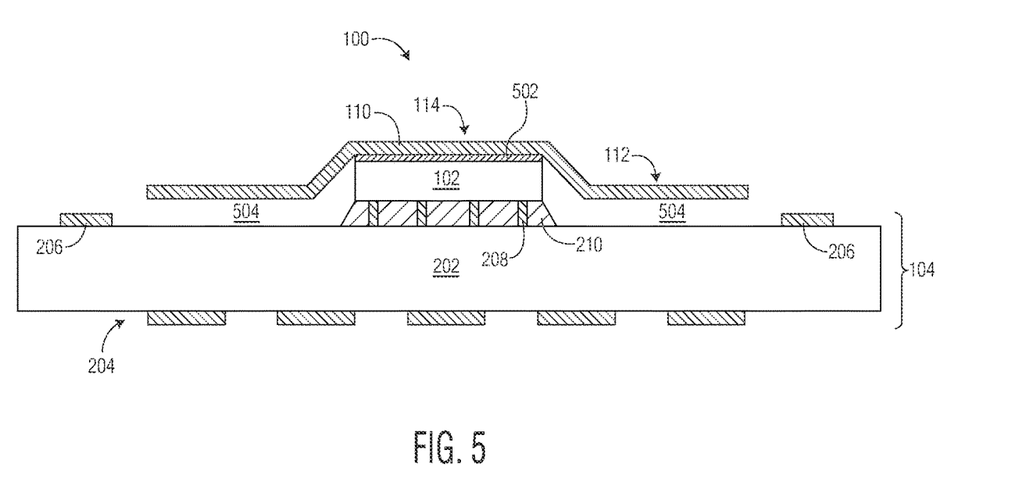
Figure 6:
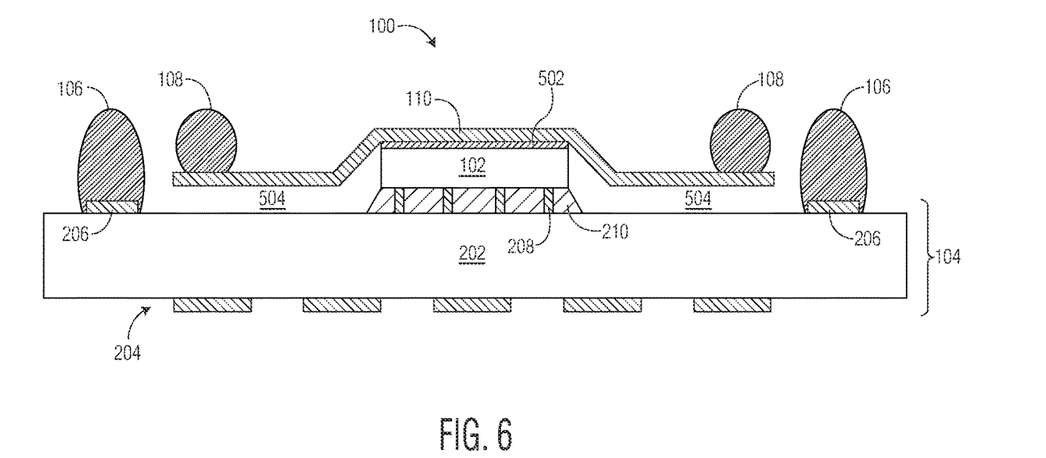

FIG. 5 and FIG. 6 illustrate, in simplified bottom-side-up cross-sectional views, the example semiconductor device package 100 taken along line A-A of FIG. 1 at alternative stages of manufacture in accordance with an embodiment. The embodiments depicted in FIG. 5 and FIG. 6 are subsequent to the stage of manufacture depicted in FIG. 2 and are alternatives to the embodiments depicted in FIG. 3 and FIG. 4.

FIG. 5 illustrates, in a simplified bottom-side-up cross-sectional view, the example semiconductor device package 100 at an alternative stage of manufacture in accordance with an embodiment. At this stage, the package 100 includes the thermal conductive structure 110 mounted on the semiconductor die 102. In this embodiment, the thermal conductive structure 110 includes the die pad portion 114 affixed to the backside of the semiconductor die 102 by way of a thermal conductive bonding material 502. The limb portions 112 extend laterally away from the die pad portion 114 and are downset forming a gap 504 between the limb portions 112 and the bottom surface of the package substrate 104. A region at the distal ends of the limb portions 112 are configured for attachment to a PCB by way of conductive connectors, for example.

FIG. 6 illustrates, in a simplified bottom-side-up cross-sectional view, the example semiconductor device package 100 at an alternative stage of manufacture in accordance with an embodiment. At this stage, the package 100 includes the thermal conductive structure 110 mounted on the semiconductor die 102 and conductive connectors 106 and 108 affixed on respective connector pads 206 and the thermal conductive structure 110. After the thermal conductive structure 110 is mounted on the semiconductor die 102, the conductive connectors 106 are affixed on the connector pads 206 and the conductive connectors 108 are affixed at the distal ends of the limb portions 112. In this embodiment, the conductive connectors 106 are coupled to provide input/output and power supply connections to the semiconductor die 102 by way of the connector pads 206.

Figure 7:
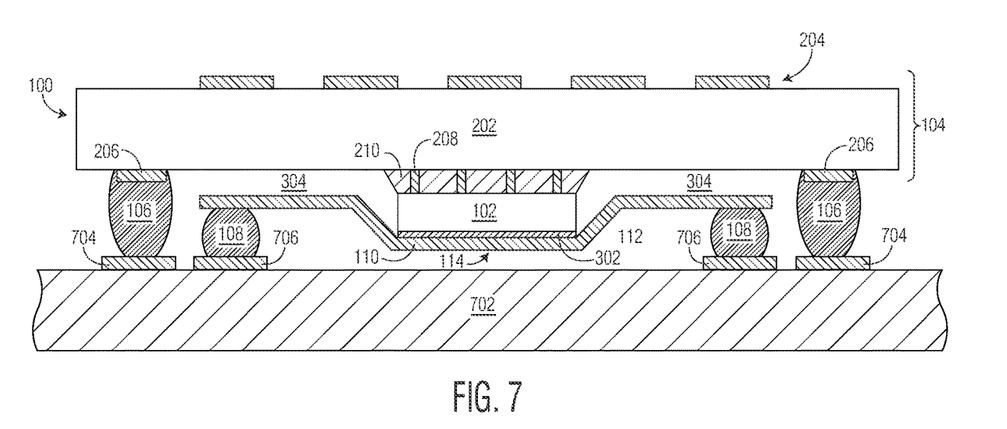
FIG. 7 illustrates, in a simplified cross-sectional view, the example semiconductor device package of FIG. 6 as mounted on a printed circuit board (PCB) in accordance with an embodiment.

FIG. 7 illustrates, in a simplified cross-sectional view, the example semiconductor device package 100 of FIG. 4 (and FIG. 6) as mounted on a PCB 702 in accordance with an embodiment. In this embodiment, the package 100 is oriented (e.g., flipped), attached and interconnected to the PCB 702 by way of the conductive connectors 106 and 108. The conductive connectors 106 and 108 are affixed to respective pads 704 and 706 of the PCB 702. In this embodiment, a thermal conduction path from the semiconductor die 102 is extended to the PCB by way of the conductive connectors 108 and the respective pads 706. In some embodiments, an additional thermal conduction path may be formed between the semiconductor die 102 and a pad (not shown) formed on the PCB directly below the die pad portion 114. Because the thermal conduction path is formed at the bottom side of the package 100, the integrated conductive structure 204 at the top surface of the package substrate remains unobstructed.

Figure 8:
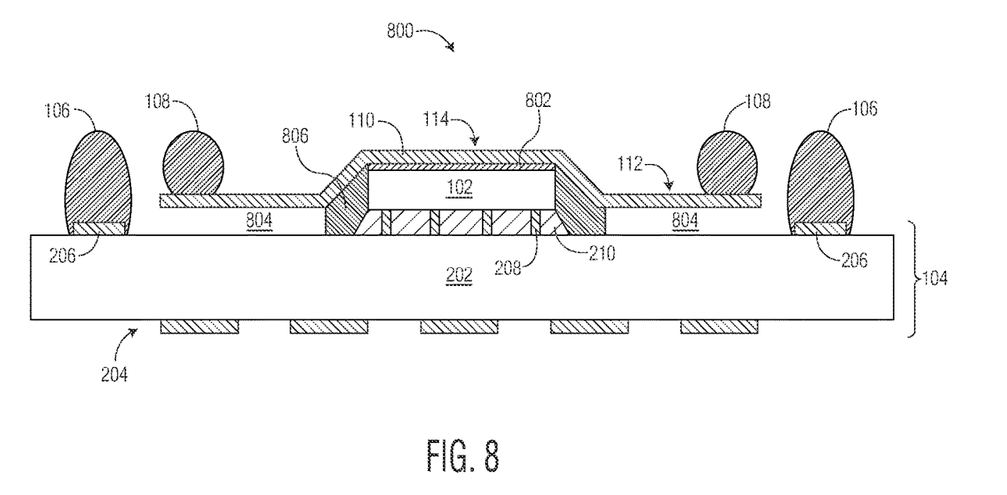
FIG. 8 illustrates, in a simplified cross-sectional view, an alternative example semiconductor device package having a thermal dissipation feature in accordance with an embodiment.

FIG. 8 illustrates, in a simplified bottom-side-up cross-sectional view, an alternative example semiconductor device package 800 having a thermal dissipation feature in accordance with an embodiment. At this stage, the package 800 includes a thermal conductive fillet 806 formed at the semiconductor die 102 to package substrate 104 transition. A thermally conductive material (e.g., thermal epoxy, paste) is dispensed around a perimeter of the semiconductor die 102 such that a fillet is formed at the semiconductor die 102 to package substrate 104 transition. The thermally conductive material may be dispensed before or after the thermal conductive structure 110 is mounted on the semiconductor die 102 by way of a thermal conductive bonding material 802. The thermal conductive fillet 806 is configured and arranged to directly contact sidewalls of the semiconductor die 102 and the thermal conductive structure 110. In this arrangement, the limb portions 112 are further supported, and additional heat dissipation paths are formed from the sidewalls of the semiconductor die 102. A gap 804 remains between the limb portions 112 and the package substrate 104. In some embodiments, the gap 804 may be an air gap or filled with a low modulus material (e.g., for additional mechanical stability) or a thermally conductive material (e.g., for additional thermal conduction, dissipation), for example. Because a thermal conduction path is formed (e.g., from the semiconductor die 102 to the conductive connector 108) at the bottom side of the package 800, the integrated conductive structure 204 at the top surface of the package substrate remains unobstructed.

Figure 9:
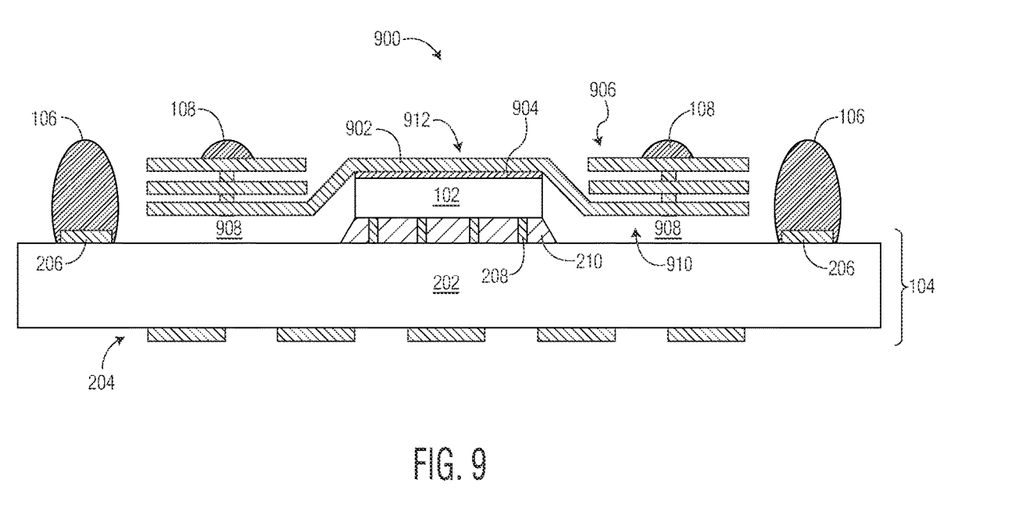
FIG. 9 illustrates, in a simplified cross-sectional view, another alternative example semiconductor device package having a thermal dissipation feature in accordance with an embodiment.

FIG. 9 illustrates, in a simplified bottom-side-up cross-sectional view, another alternative example semiconductor device package 900 having a thermal dissipation feature in accordance with an embodiment. At this stage, the package 900 includes a thermal conductive structure 902 mounted on the semiconductor die 102 and conductive connectors 106 and 108 affixed on respective connector pads 206 and the thermal conductive structure 902. In this embodiment, the thermal conductive structure 902 includes a die pad portion 912 affixed to the backside of the semiconductor die 102 by way of a thermal conductive bonding material 904. Limb portions 910 of the thermal conductive structure 902 extend laterally away from the die pad portion 912 and are downset forming a gap 908 between the limb portions 910 and the package substrate 104. In this embodiment, the thermal conductive structure 902 includes example thermal radiation fins 906 formed on the limb portions 910 and configured for additional heat dissipation. The thermal radiation fins 906 may be formed from similar materials (e.g., copper) as the thermal conductive structure 902, and formed in various suitable shapes and orientations. In some embodiments, the outer-most surface of the thermal radiation fins 906 may be configured for direct contact with a PCB using a thermal paste, for example. In some embodiments, the outer-most surface of the thermal radiation fins 906 may be configured for a direct solder connection with a PCB without using conductive connectors, for example. Because a thermal conduction path is formed (e.g., from the semiconductor die 102 to the conductive connector 108) at the bottom side of the package 800, the integrated conductive structure 204 at the top surface of the package substrate remains unobstructed.

Figure 10A:
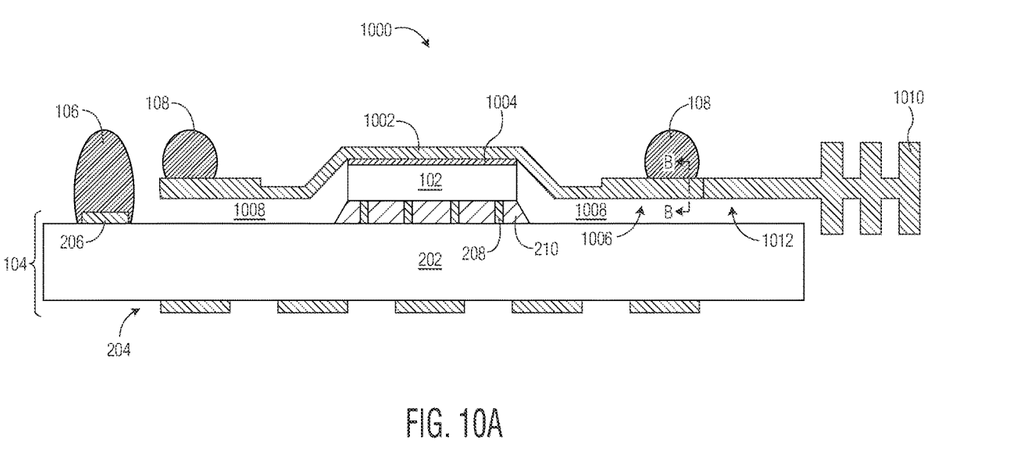
FIG. 10A and FIG. 10B illustrate, in simplified cross-sectional views, an alternative example semiconductor device package configured with an external heatsink in accordance with an embodiment.

FIG. 10A illustrates, in a simplified bottom-side-up cross-sectional view, an alternative example semiconductor device package 1000 configured with an external heatsink structure 1010 in accordance with an embodiment. At this stage, the package 1000 includes a thermal conductive structure 1002 mounted on the semiconductor die 102 and attached to the external heatsink structure 1010. Conductive connectors 106 and 108 are affixed on respective connector pads 206 and the thermal conductive structure 1002. Cross-sectional views of an example interlocking connection structure taken along line B-B is depicted in FIG. 10B.

In the embodiment depicted in FIG. 10A, the thermal conductive structure 1002 includes a die pad portion affixed to the backside of the semiconductor die 102 by way of a thermal conductive bonding material 1004. Limb portions of the thermal conductive structure 1002 extend laterally away from the die pad portion and are downset forming a gap 1008 between the limb portions and the package substrate 104. In this embodiment, the thermal conductive structure 1002 includes an example interlocking connection structure portion 1006 formed at the distal ends of the limb portions and configured for attachment of the external heatsink structure 1010 for additional heat dissipation. When the external heatsink structure 1010 is joined with the thermal conductive structure 1002, a continuous thermal conduction path from the semiconductor die 102 to the external heatsink structure 1010 is formed. The external heatsink structure 1010 may be formed from a suitable metal (e.g., copper) having any suitable structure configured for heat dissipation. In this embodiment, a thermal conduction path also extends to the PCB by way of the conductive connectors 108 affixed on the thermal conductive structure 1002. Because the thermal conduction paths are formed at the bottom side of the package 1000, the integrated conductive structure 204 at the top surface of the package substrate 104 remains unobstructed.

Figure 10B:
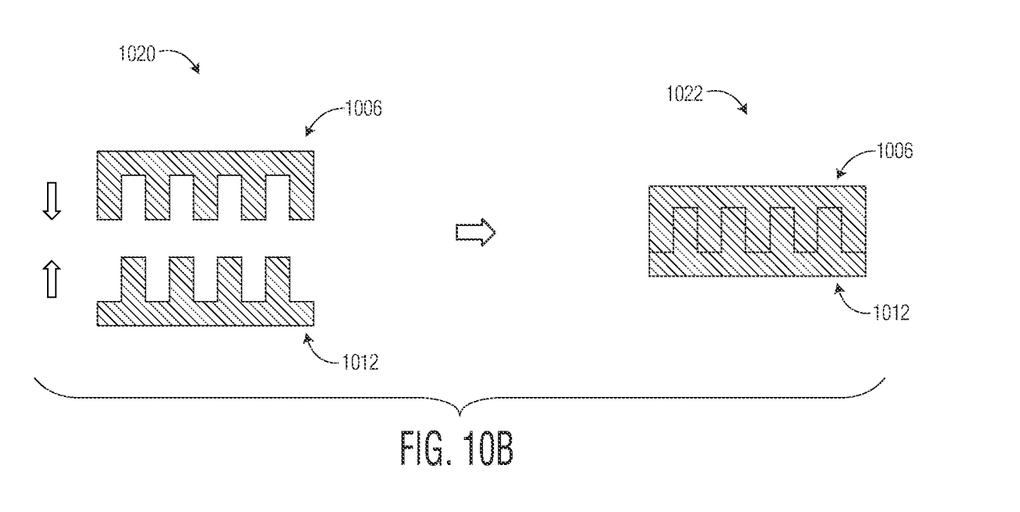

The example interlocking connection structure taken along line B-B is shown in more detail in FIG. 10B. The connection structure portion 1006 of the thermal conductive structure 1002 and a corresponding interlocking connection structure portion 1012 of the external heatsink 1010 are depicted in an unmated arrangement 1020. The top side of the connection structure portion 1006 is configured for attachment to a PCB by way of conductive connectors 108, for example. The bottom side interlocking features may serve as a heatsink, for example, when an external heatsink is not attached. The corresponding interlocking connection structure portion 1012 formed on the external heatsink structure 1010 is configured for mating with the connection structure portion 1006. The connection structure portion 1006 interlocked with the corresponding connection structure portion 1012 is depicted in a mated arrangement 1022. The example interlocking connection structure, when in the mated arrangement 1022, ensures a sufficient thermal conduction. A thermal grease or paste applied on interlocking features may further increase the thermal conductivity of the interlocking connection structure.

Figure 11:
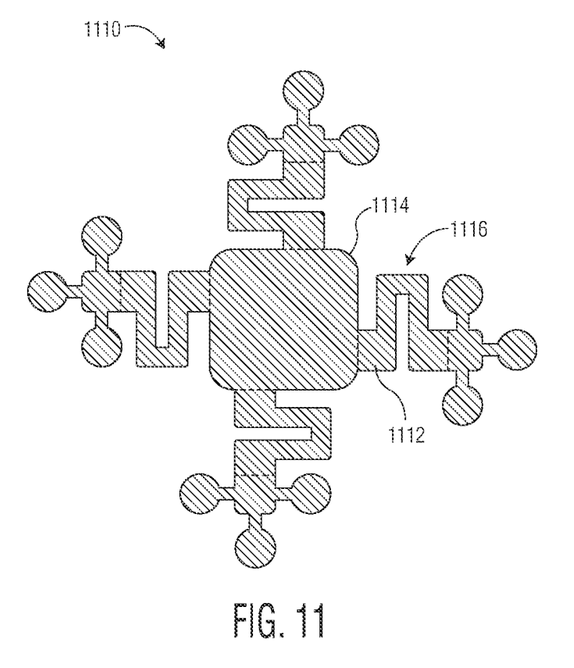
FIG. 11 illustrates, in a simplified bottom-side-up plan view, an example thermal conductive structure with a stress reducing feature in accordance with an embodiment.

FIG. 11 illustrates, in a simplified bottom-side-up plan view, an example thermal conductive structure 1110 with a stress reducing feature in accordance with an embodiment. The thermal conductive structure 1110 depicted in FIG. 11 is an alternative to the thermal conductive structure 110 depicted in FIG. 1. The thermal conductive structure 1110 is configured for attachment on a semiconductor die for improved heat dissipation. In this embodiment, the thermal conductive structure 1110 includes a die pad portion 1114 and four limb portions 1112 extending laterally away from the die pad portion. The limb portions 1112 include a region formed at a distal end of each limb configured for attachment to a PCB by way of conductive connectors, for example. The thermal conductive structure 1110, when affixed to the semiconductor die, forms a thermal conduction and heat dissipation path between the semiconductor die and the conductive connectors.

In this embodiment, each limb portion 1112 includes a U-shaped stress relief feature 1116 formed between the die pad portion 1114 and the distal end of the limb portion 1112. The stress relief feature 1116 is configured to allow more flexibility in the limb portions 1112 after being affixed to a PCB, for example. The stress relief feature 1116 also provides more surface area for heat dissipation. The thermal conductive structure 1110 may be formed from suitable thermal conductive materials such as copper, silver, nickel, aluminum, and the like. The thermal conductive structure 1110 including the die pad portion 1114 and the limb portions 1112 may be formed from a stamped or etched metal sheet. For example, the thermal conductive structure 1110 may be manufactured in a manner consistent with the manufacture of a package leadframe.

Generally, there is provided, a semiconductor device package including a package substrate having a first major surface and a second major surface; a semiconductor die mounted on the first major surface of the package substrate; and a thermal conductive structure including a die pad portion affixed to the semiconductor die and a limb portion extending laterally away from the die pad portion, the limb portion located substantially over a portion of the package substrate, the thermal conductive structure configured to form a thermal conduction path between the semiconductor die and a distal end of the limb portion. A region at the distal end of the limb portion may be configured for attachment to a printed circuit board by way of a first conductive connector. The semiconductor device package may further include a connector pad at the first surface of the package substrate, the connector pad configured for attachment to the printed circuit board by way of a second conductive connector. The thermal conductive structure including the die pad portion and the limb portion may be formed from a stamped or etched metal sheet. The semiconductor device package may further include a thermal conductive fillet formed at the semiconductor die to package substrate transition, the fillet directly contacting sidewalls of the semiconductor die and the thermal conductive structure. The semiconductor device package may further include an antenna structure integrated at the second surface of the package substrate. The thermal conductive structure may further include one or more thermal conductive fins attached to the limb portion of the thermal conductive structure. The limb portion the thermal conductive structure may include a stress relief feature configured to reduce stress when the limb portion is attached to a printed circuit board. The distal end of the limb portion of the thermal conductive structure may be further configured for attachment of an external heatsink structure.

In another embodiment, there is provided, a method including mounting a semiconductor die on a first surface of a package substrate; providing a thermal conductive structure including a die pad portion and a limb portion extending laterally away from the die pad portion; and affixing the die pad portion of the thermal conductive structure to the semiconductor die, the limb portion suspended over a portion of the package substrate. The method may further include affixing a first conductive connector at a distal end of the limb portion of the thermal conductive structure, the first conductive connector configured for attachment to a printed circuit board. The method may further include affixing a second conductive connector on a connector pad located at first surface of the package substrate, the second conductive connector configured for attachment to the printed circuit board. The package substrate may include an antenna structure integrated at a second surface of the package substrate. The method may further include forming a thermal conductive fillet at the semiconductor die to package substrate transition, the fillet directly contacting sidewalls of the semiconductor die and the thermal conductive structure. The limb portion of thermal conductive structure may be downset relative to the die pad portion of the thermal conductive structure. The affixing the die pad portion of the thermal conductive structure to the semiconductor die may include affixing the die pad portion to the semiconductor die by way of a thermally conductive adhesive or solder.

In yet another embodiment, there is provided, a semiconductor device package including a package substrate having a first major surface and a second major surface; a semiconductor die having an active side and a backside, the active side mounted on the first major surface of the package substrate; and a thermal conductive structure having a die pad portion affixed to the backside of the semiconductor die and a limb portion extending laterally away from the die pad portion, the limb portion located substantially over a portion of the package substrate, a gap formed between the limb portion and the first major surface of the package substrate. The semiconductor device package may further include a first conductive connector affixed at a distal end of the limb portion and configured for attachment to a printed circuit board, a thermal conduction path formed between the semiconductor die and the first conductive connector. The semiconductor device package may further include a second conductive connector affixed on a connector pad at first surface of the package substrate, the second conductive connector configured for attachment to the printed circuit board. The first conductive connector and the second conductive connector may be characterized as balls of a ball grid array (BGA) package.

By now, it should be appreciated that there has been provided a semiconductor device package having a thermal dissipation feature. An external thermal conductive structure is affixed to a semiconductor die to form the thermal dissipation structure at a bottom of the package. The external thermal conductive structure includes a die pad portion and a plurality of limb portion which extend over the package substrate. The bottom of the package is attached and interconnected with a printed circuit board by way of conductive connectors. The thermal conductive structure forms a thermal conduction path between the semiconductor die and the printed circuit board. With the thermal conductive structure affixed at the bottom of the package, a top surface of the package remains unobstructed. Accordingly, an antenna structure integrated at the top surface of the package allows for propagation of radio signals, for example, while providing enhanced heat dissipation at the bottom surface of the package. Other features such as a package-on-package interface structure, surface mount technology structure, die bonding structure, shielding structure, and the like may be integrated at the top surface of the package.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
a package substrate having a first major surface and a second major surface;
a semiconductor die mounted on the first major surface of the package substrate; and
a thermal conductive structure including a die pad portion affixed to the semiconductor die and a limb portion extending laterally away from a first edge of the die pad portion in a first direction parallel to the first major surface, the limb portion having a width less than a width of the die pad portion at the first edge measured in a second direction that is parallel to the first major surface and perpendicular to the first direction, the limb portion overhanging a portion of the package substrate;
wherein the thermal conductive structure is configured to form a thermal conduction path between the semiconductor die and a distal end of the limb portion that is suspended directly above the first major surface of the package substrate;
wherein a region at the distal end of the limb portion is configured for attachment to a printed circuit board by way of a first conductive connector disposed on a side of the limb portion that faces away from the package substrate; and
wherein the semiconductor device package further comprises a connector pad at the first major surface of the package substrate, the connector pad configured for attachment to the printed circuit board by way of a second conductive connector.

2. The semiconductor device package of claim 1, wherein the thermal conductive structure including the die pad portion and the limb portion is formed from a stamped or etched metal sheet.

3. The semiconductor device package of claim 1, further comprising a thermal conductive fillet formed at the semiconductor die to package substrate transition, the fillet directly contacting sidewalls of the semiconductor die and the thermal conductive structure.

4. The semiconductor device package of claim 1, further comprising an antenna structure integrated at the second surface of the package substrate.

5. The semiconductor device package of claim 1, wherein the thermal conductive structure further comprises one or more thermal conductive fins attached to the limb portion of the thermal conductive structure.

6. The semiconductor device package of claim 1, wherein a width of the thermal conductive structure between the first edge of the die pad portion and the distal end of the limb portion is equal to the width of the limb portion.

7. A semiconductor device package, comprising:
a package substrate having a first major surface and a second major surface;
a semiconductor die mounted on the first major surface of the package substrate;
a thermal conductive structure including a die pad portion affixed to the semiconductor die and a limb portion extending laterally away from a first edge of the die pad portion in a first direction parallel to the first major surface, the limb portion having a width less than a width of the die pad portion measured in a second direction that is parallel to the first major surface and perpendicular to the first direction, the limb portion overhanging a portion of the package substrate;
a first electrical connector pad on the first major surface configured to allow the first major surface to be bonded to a printed circuit board or other carrier;
wherein the thermal conductive structure is configured to form a thermal conduction path between the semiconductor die and a distal end of the limb portion that is suspended directly above the package substrate; and
wherein the limb portion of the thermal conductive structure includes a stress relief feature configured to reduce stress when the limb portion is attached to the printed circuit board or other carrier.

8. A method comprising:
mounting a semiconductor die on a first surface of a package substrate;
providing a thermal conductive structure including a die pad portion and a limb portion, the limb portion extending laterally away from a first edge of the die pad portion in a first direction parallel to the first surface, the limb portion having a width less than a width of the die pad portion at the first edge measured in a second direction that is parallel to the first major surface and perpendicular to the first direction; and affixing the die pad portion of the thermal conductive structure to the semiconductor die, the limb portion suspended directly over a portion of the package substrate at a distal end of the limb portion;

wherein the method further comprises affixing a first conductive connector at a distal end of the limb portion of the thermal conductive structure, the first conductive connector configured for attachment to a circuit board; and affixing a second conductive connector on a connector pad located at first surface of the package substrate, the second conductive connector configured for attachment to the circuit board.

9. The method of claim 8, wherein the package substrate includes an antenna structure integrated at a second surface of the package substrate.

10. The method of claim 8, further comprising forming a thermal conductive fillet at the semiconductor die to package substrate transition, the fillet directly contacting sidewalls of the semiconductor die and the thermal conductive structure.

11. The method of claim 8, wherein the limb portion of thermal conductive structure is downset relative to the die pad portion of the thermal conductive structure.

12. The method of claim 8, wherein affixing the die pad portion of the thermal conductive structure to the semiconductor die includes affixing the die pad portion to the semiconductor die by way of a thermally conductive adhesive or solder.

13. A semiconductor device package comprising:

a package substrate having a first major surface and a second major surface;

a semiconductor die having an active side and a backside, the active side mounted on the first major surface of the package substrate;

a thermal conductive structure having a die pad portion affixed to the backside of the semiconductor die and a limb portion extending laterally away from a first edge of the die pad portion in a first direction that is parallel to the first major surface, the limb portion having a width less than a width of the die pad portion at the first edge measured in a second direction that is parallel to the first major surface and perpendicular to the first direction, the limb portion suspended directly over a portion of the package substrate, a gap formed between the limb portion and the first major surface of the package substrate;

a first conductive connector affixed at a distal end of the limb portion on a surface of the limb portion that faces away from the first major surface and configured for attachment to a circuit board; and a second conductive connector affixed on a connector pad at the first major surface of the package substrate, the second conductive connector configured for attachment to the circuit board;

wherein the entire limb portion of the thermal conductive structure is separated from the package substrate by the gap.

14. The semiconductor device package of claim 13, wherein a thermal conduction path is formed between the semiconductor die and the first conductive connector.

15. The semiconductor device package of claim 13, wherein the first conductive connector and the second conductive connector are characterized as balls of a ball grid array (BGA) package.

* * * * *